United States Patent [19]

Mitra et al.

[11] Patent Number: 5,707,242
[45] Date of Patent: Jan. 13, 1998

[54] SYSTEM AND CONNECTORS FOR THE ELECTRICAL INTERCONNECTION OF COMPONENT BOARDS

[76] Inventors: Niranjan Kumar Mitra, Robijnring 27, NL-5629, GH Eindhoven; Petrus Wouter Hendrikus Schalk, Hudsonring 90, NL-5152, VS Drunen, both of Netherlands

[21] Appl. No.: 256,755

[22] PCT Filed: Jan. 22, 1993

[86] PCT No.: PCT/NL93/00023

§ 371 Date: Feb. 3, 1995

§ 102(e) Date: Feb. 3, 1995

[87] PCT Pub. No.: WO93/15534

PCT Pub. Date: Aug. 5, 1993

[30] Foreign Application Priority Data

Jan. 22, 1992 [NL] Netherlands ............................ 9200117

[51] Int. Cl.⁶ .................................................... H01R 9/09
[52] U.S. Cl. .................................................... 439/74; 439/78
[58] Field of Search ................................. 439/65, 74, 75, 439/78

[56] References Cited

U.S. PATENT DOCUMENTS

| | | |
|---|---|---|
| 3,663,931 | 5/1972 | Brown ............................ 439/75 OR |
| 3,871,723 | 3/1975 | Goodman . |
| 4,035,047 | 7/1977 | Ammon ............................ 439/78 OR |
| 4,232,924 | 11/1980 | Kline et al. . |
| 4,686,607 | 8/1987 | Johnson ............................ 439/78 X |
| 4,881,905 | 11/1989 | Demler, Jr. et al. ............ 439/79 |
| 5,137,454 | 8/1992 | Baechtle ............................ 439/78 X |
| 5,176,526 | 1/1993 | Hillbish et al. ............... 439/74 X |
| 5,181,855 | 1/1993 | Mosquera et al. ............. 439/74 OR |
| 5,376,009 | 12/1994 | Olsson et al. ................ 439/74 X |
| 5,507,653 | 4/1996 | Stoner ............................ 439/74 OR |

FOREIGN PATENT DOCUMENTS 0 456 856 A1   5/1990   European Pat. Off. .

*Primary Examiner*—P. Austin Bradley
*Assistant Examiner*—Daniel Wittels
*Attorney, Agent, or Firm*—Woodcock Washburn Kurtz Mackiewicz & Norris LLP

[57] ABSTRACT

A system or connector/board assembly for electrically detachably interconnecting component boards (1) having connectors (10, 13) positioned opposite one another on both sides of a board (1). The connectors (10, 13) are each mounted rigidly on the board (1) because at least one terminal end (24) of a contact element (16, 18; 17, 19) of a connector (10, 13) is received in a hole (27) of a pattern (26) of holes (27) provided in the board (1), which terminal end (24) is provided with means (25) for the clamping mounting thereof in the respective hole (27). In this manner, connectors (10, 13) can be mounted adjacently on the component board (1) without the loss of position of a contact element.

6 Claims, 3 Drawing Sheets

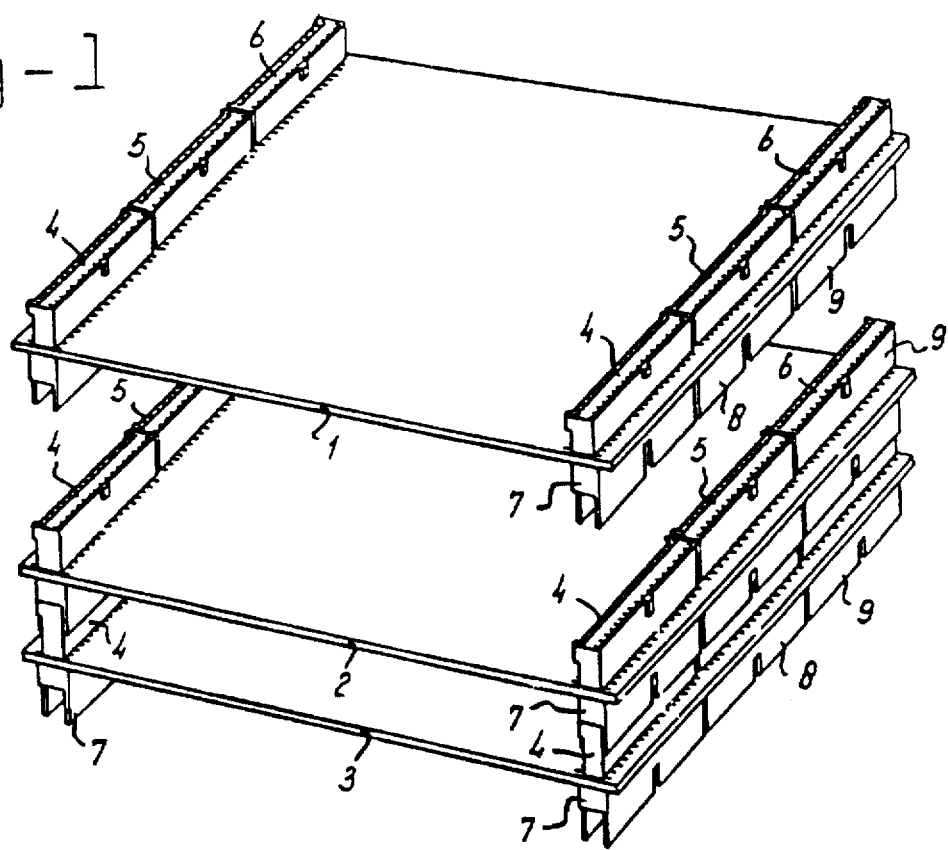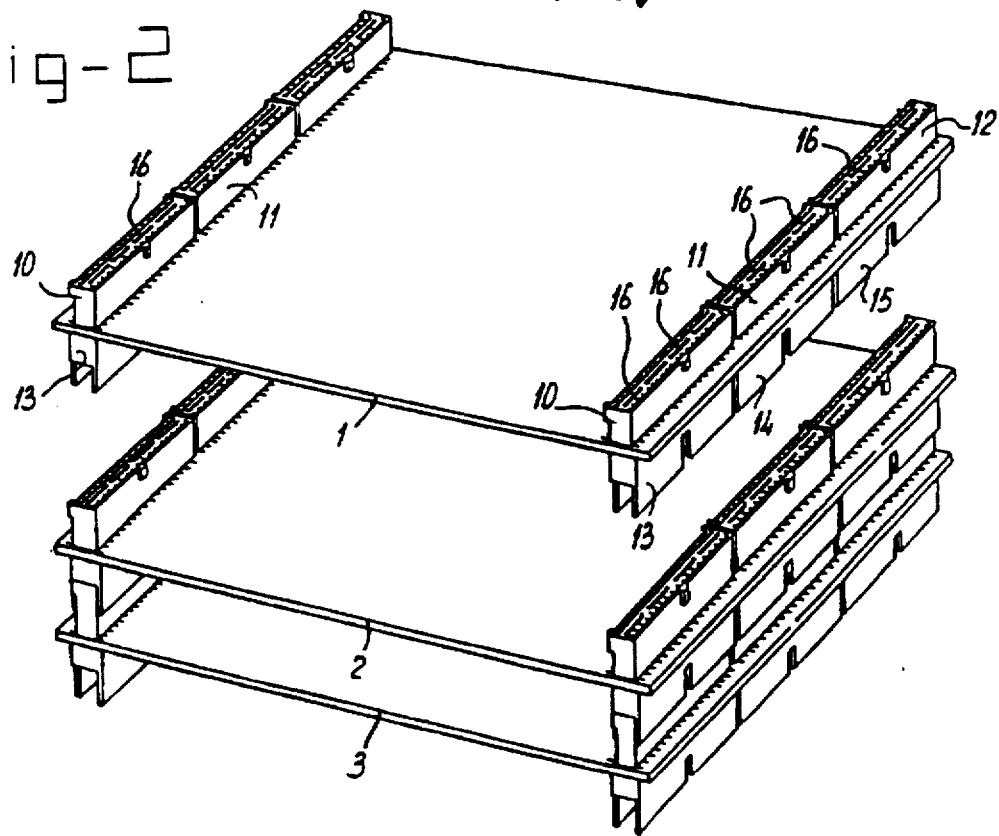

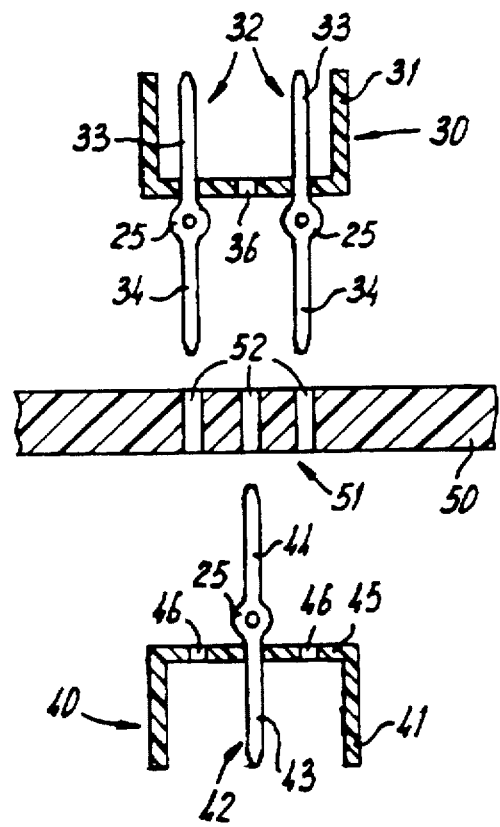
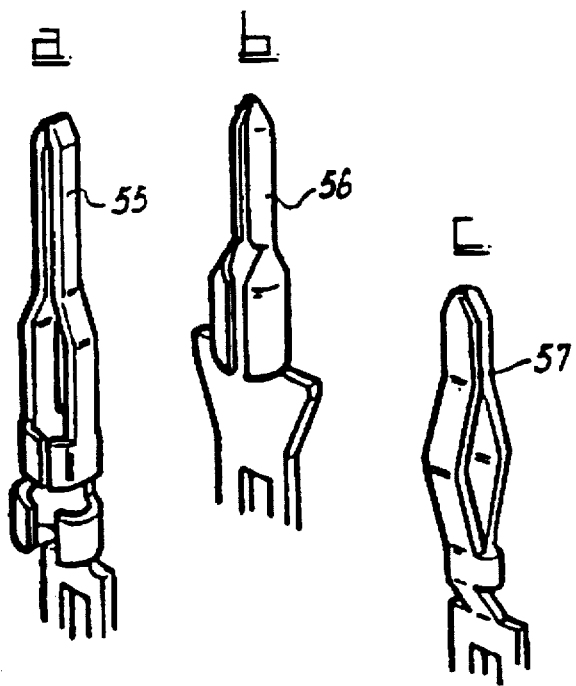

SYSTEM AND CONNECTORS FOR THE ELECTRICAL INTERCONNECTION OF COMPONENT BOARDS

FIELD OF THE INVENTION

The invention relates to a system or connector/board assembly for the electrical interconnection of component boards having connectors positioned opposite one another on both sides of a board, each connector being secured to its' board and comprises a housing of electrically insulating material provided with a plurality of contact elements of electrically conducting material having a contact end for making contact to a further contact element and a terminal end for connecting electrical wiring, the board being provided with a hole pattern for receiving terminal ends therein.

BACKGROUND OF THE INVENTION

Systems of this type are used in practice, for example, for the stack interconnection of component boards or, for example, for the connection, on a component board, also referred to as mother board or mother panel, of one or more further component boards, also referred to as daughter boards or daughter panels, on both sides. These daughter boards may per se be provided in turn with connectors on both sides for forming a stack of daughter boards or for connecting yet further component boards, also referred to as baby boards or baby panels, thereto.

A system of this type is disclosed, for example, by DE-A-3,323,029 use being made, however, of connectors having projections situated at the end faces of the housing for mounting the respective connector housing on the component board by means of a screw or rivet joint. This manner of mounting the housings on the component board has the disadvantage that, as a consequence of the projections extending laterally from the connector housing for the mounting thereof, it is not possible to mount a plurality of connectors adjacently to one another without loss of a contact element position on the component board. In the English-language literature this is also known as "end-to-end stacking".

A major object of the invention is to provide a system or assembly of the type mentioned above, in particular, having end-to-end stackable connectors mounted sufficiently rigidly on the respective component board.

According to the invention this is achieved in that at least one terminal end of a contact element of the connector situated on one side of the board and at least one terminal end of a contact element of the connector situated on the other side of the board are received in a different hole of the hole pattern, which at least one terminal ends are provided with means for the clamping reception thereof in the respective hole of the hole pattern of the board.

It will be understood that, as more contact elements are provided with such means for clamping mounting in a hole of the hole pattern, the respective connector is secured mechanically more rigidly on the component board. As the dimensions of a connector become greater, it is also advisable to provide more contact elements with clamping means.

It is noted that contact elements having terminal ends provided with means for clamplingly reception in a hole of a component board are, amongst others, disclosed by U.S. Pat. No. 4,232,924. However, using said contact elements in a connector/board assembly having oppositely positioned connectors on each side of a board, such to provide for an end-to-end stackable connector/board assembly of this type, is not disclosed nor suggested by said US patent specification.

In a large number of applications it is common to connect the contact elements of a connector electrically in such a manner that at least one contact element connected to the signal earth or to a supply terminal decoupled to the signal earth is situated between signal-carrying contact elements. This provides an effective electrical shielding between the signal-carrying contacts.

The system according to the invention is suitable, in particular, for connecting connectors having contact elements connected in this manner, for which purpose, in a further embodiment, the component board is provided with one or more mutually electrically insulated wiring layers, the means of a contact element for the clamping reception thereof in a hole of the hole pattern making electrical contact with one or more of the wiring layers.

One of the wiring layers may, for example, be connected to the signal earth of the system and one or more of the other wiring layers may be connected to the supply voltage.

U.S. Pat. No. 3,963,301 also discloses a system of the type mentioned at the outset, wherein connectors are used which are provided with contact elements having two oppositely situated contact ends, of which at least one of the contact ends is designed as plug or pin contact, which plug contacts project out of the housing of the connector in the same direction. In the mounted state of the respective connector, the plug contacts extend through the component board from the one side and out the other side thereof via the hole pattern. A further housing only provided with matchingly situated passage openings is then mounted over these plug contacts. This results in two connectors mounted oppositely on the one side and other side of the component board. The respective further housing does not have any means for the mounting thereof on the component board and is essentially secured on the component board by the sum of the frictional forces between the walls of the passage openings of the housing and the plug contacts received therein. Such a system is unsuitable for use with component boards which are subject to vibration, such as, for example, in equipment in vehicles. A mounting means extending laterally from the respective further housing has the disadvantage that an end-to-end stackable connector system cannot be built up therewith.

In a further embodiment of the system according to the invention, this problem is solved in that one or more of the contact elements of a connector is or are provided with a first and second oppositely situated contact end, the means for the clamping reception thereof in a hole of the hole pattern being situated between the two contact ends and at least said second contact ends being designed as a plug or pin contact, which plug contacts and the means for the clamping reception thereof in a hole project out of the housing of the connector in the same direction, and the housing is provided with passage openings for the reception of plug contacts, the contact elements and passage openings of the connector on the one side of the board and the contact elements and passage openings of the connector on the other side of the board, as well as the holes of the hole pattern, being mutually arranged in such a manner that the plug contacts, extending outside of the housing, of the one connector engage, via the hole pattern, in the passage opening of the other, oppositely situated connector, the two connectors being rigidly connected to the board via the means for the clamping reception thereof in a hole of the hole pattern.

Because, in this embodiment, in contrast to the prior art, both connectors situated opposite one another are provided with contact elements having means for the clamping reception thereof in a hole of the hole pattern in such a manner that the contact elements of the one and the other connector mutually engage in one another's housing in the mounted state, a connector connection as described above is produced, hut in contrast to U.S. Pat. No. 3,963,301 the two housings are rigidly mounted on the component board.

The system or assembly according to the invention is suitable, in particular, for use with connectors provided with shielding members of electrically conducting material and having a terminal end for connecting electrical wiring, at least one terminal end of a shielding member of the connectors being provided with means for the clamping reception thereof in a hole of the hole pattern of the board.

This embodiment of the system according to the invention is also suitable for connectors having contact elements provided with terminal ends for surface-mounting technology and having one or more of such shielding members with which the connectors are rigidly mounted on the component board.

The respective shielding members may advantageously be connected to one or more wiring layers of the component board for the mutual electrical shielding of signal-carrying contact elements and/or for connecting supply voltage. The terminal ends of the shielding members and the hole pattern can also be mutually matched to one another in such a manner that a system or assembly having connectors with a desired pitch of the contact elements or the terminal ends thereof can be achieved.

However, in the case of relatively thin component boards or boards having wiring layers as described above, in a further embodiment of the system or assembly of the invention, wherein the hole pattern in the board consists of one or more rows of holes, the terminal ends having means for the clamping reception thereof in a hole also being arranged in rows in such a manner that the respective terminal ends of the oppositely situated connectors each engage in a different hole of a row.

In order to prevent that the board becomes warped, in a yet further embodiment of the invention the respective terminal ends of the oppositely situated connectors alternately engage in a hole of a row.

For providing a stack of parallel component hoards, in another embodiment of the system or assembly of the invention the connectors on one side of the board are designed such that they can mate with the connectors on the other side of a further board.

Thus, for example, the connectors mounted on one side of the component board may have contact ends exclusively designed as a female contact, whereas the connectors positioned on the other side of the board are exclusively designed as male contacts. Component boards of this type, also called hermaphrodite boards, can be interconnected facing their one and other sides, respectively. It will be understood that also mating connectors having a mix of male and female contact ends or a mix of male or female connectors mately mounted on either side of a board may be used.

In a yet further embodiment of the system according to the invention, the connectors are provided with end-to-end stackable housings.

The invention also relates to connectors for oppositely positioning on both sides of a component board in a system or assembly described above, provided with a housing of electrically insulating material having a plurality of contact elements of electrically conducting material, having a contact end for making contact to a further contact element and a terminal end for connecting electrical wiring, and having shielding members of electrically conducting material received in the housing, said shielding members having a terminal end for connecting electrical wiring, wherein at least one terminal end of a shielding member is provided with means for the clamping reception thereof in a hole of a component board.

The invention furthermore relates to connectors for oppositely positioning on both sides of a component board in a system or assembly described above, provided with a housing of electrically insulating material having a plurality of contact elements of electrically conducting material, wherein one or more of the contact elements of a connector is or are provided with a first and second oppositely situated contact end, means being situated between the two contact ends for the clamping reception thereof in a hole of a component board, and at least said second contact ends being designed as a plug contact, which plug contacts and the means for the clamping reception thereof in a hole project out of the housing of the connector in the same direction, the housing being provided with passage openings for the reception of plug contacts.

BRIEF DESCRIPTION OF THE DRAWINGS

The invention is explained in greater detail below by reference to exemplary embodiments shown in the drawings.

FIG. 1 shows schematically and in perspective a system according to the invention, consisting of a plurality of component boards arranged in a stack and having, on either side, end-to-end stackable connectors positioned opposite one another for surface-mounting technology.

FIG. 2 shows, in the same manner as FIG. 1, a system according to the invention, provided with connectors with shielding members received therein.

FIG. 4 shows schematically, partly in cross section and elevation, an embodiment of the system according to the invention provided with connectors having contact elements with two contact ends and having passage openings in the housing for the reception of contact ends of an oppositely positioned connector.

FIG. 5 shows diagrammatically and in perspective various embodiments of means for the clamping reception thereof in a hole of a component board.

DETAILED DESCRIPTION OF PREFERRED EMBODIMENTS

Figure 3:
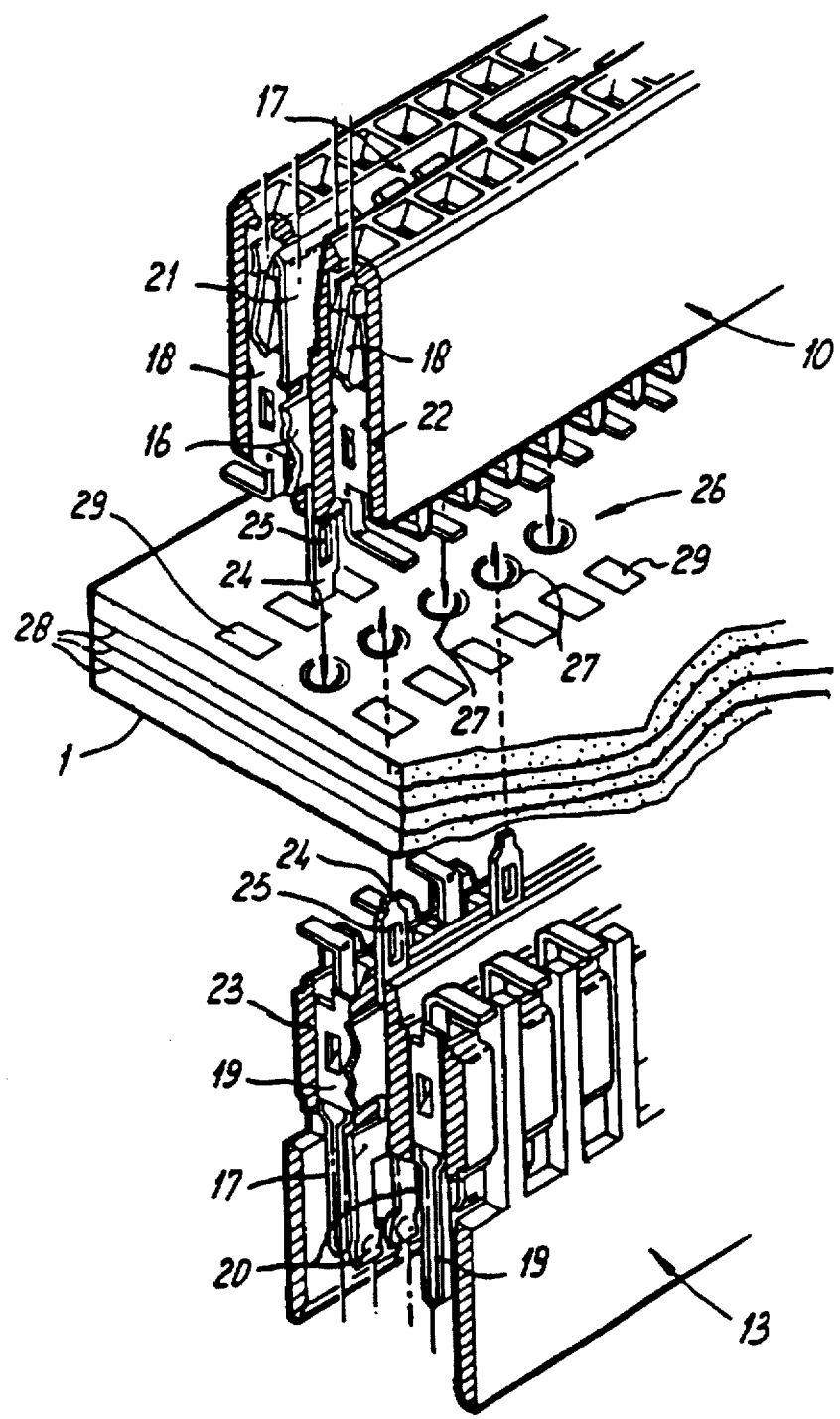
FIG. 3 shows schematically and in perspective a portion of the connectors according to FIG. 2 on an enlarged scale before mounting on a component board.

FIG. 1 shows a number of so called hermaphrodite component boards 1, 2, 3 having female connectors 4, 5, 6 and male connectors 7, 8, 9, mounted opposite one another on either side of each board. For the sake of clarity, no further components are shown on the boards 1, 2, 3, but it will be clear that, depending on the desired application of the respective component board, integrated circuits, resistors, capacitors and other electrical and/or electronic components can be mounted thereon. The connectors 7–9 of component board 2 and the connectors 4–6 of the component board 3, respectively, are shown in their mated state.

Instead of forming a stack of parallel component boards, it is, of course, also possible to position further component boards, referred to as daughter panels or daughter boards, transversely on a component board, and/or yet further component boards, referred to as baby boards or baby panels, mounted on the daughter boards (not shown). The connectors 4-9 shown in FIG. 1 are all of the type for mounting the terminal ends of the contact elements of the respective connectors on the component board by means of the surface-mounting technology which is known per se.

FIG. 2 shows, in the same manner as FIG. 1, a number of component boards, but provided with female connectors 10, 11, 12 and male connectors 13, 14, 15, having shielding members 16, 17 of electrically conducting material received in their housings.

FIG. 3 shows, on an enlarged scale, a cross section of a portion of the connector 10 and 13, respectively, according to FIG. 2.

The contact elements 18 of the connector 10 having plastic housing 22 are designed as a female or receiving contact, whereas the contact elements 19 of the connector 13 having plastic housing 23 form male or plug contacts. Between the two rows of contact elements 18 and 19, respectively, there are shielding members 16 and 17, respectively, in the form of electrically conducting plates. The shielding members 17 are provided with contact fingers 20 for making contact to plate-type contact parts 21 of the shielding members 16. As can be seen in the case of connector 10, the shielding members 16, 17 can be alternately arranged, and if necessary mutually electrically connected, in a connector housing.

To mount the connectors 10, 13 on the component board 1, the shielding members 16, 17 are provided with terminal ends 24 having clamping members 25 which, in the mounted state of a connector, engage in a clamping fashion in a hole 27 of a hole pattern 26 provided in the component board 1. In the mounted state of the connectors 10, 13, they are rigidly secured on the component board 1 by means of the clamping members 25.

Although only the shielding members 16, 17 are provided with clamping members 25 in FIG. 3, it will be clear that one or more of the contact elements 18, 19 can also be provided with clamping means for the reception thereof in a matchingly situated hole of a hole pattern. As shown in FIG. 3, the terminal ends, provided with clamping members 25, of the connectors 10, 13 alternately engage in a hole 27 of the hole pattern 26 designed as a row of holes. The position of the holes 27 and the clamping members 25 are to be chosen freely in such a manner that a suitable hole position can be found for any desired, achievable pitch of the contact elements.

In this embodiment, the component board 1 is provided with three electrically conducting wiring layers 28. Furthermore, terminal patches 29 are shown for connecting the contact elements 18, 19 by the surface-substitute mounting technique.

FIG. 4 shows an embodiment of the system according to the invention in which use is made of connectors 30 provided with a housing 31 of electrically insulating material having electrically conducting contact elements 32 which are received therein and are provided at both ends with a plug or pin contact 33, 34, the plug contacts 34 projecting outwards from the base wall part 35 of the housing 31. The base wall part 35 is furthermore provided with openings 36 which are arranged, for example, centrally between the contact elements 32.

At the other side of the component board 50, there is shown a similar further connector 40 which is situated opposite the connector 30 and which is provided with a housing 41 of electrically insulating material, having contact elements 42 of electrically conducting material, and having a first plug or pin contact end 43 and a second plug or pin contact 44 extending from the base wall part 45 of the housing 41. The base wall part 45 is furthermore provided with openings 46 on either side of the contact elements 42.

The plug contacts 34, 44 extending outside the housing 31 and 41, respectively, are furthermore provided with clamping members 25 as shown in FIG. 3.

The component board 50 has a hole pattern 51 with through holes 52.

The holes 52, the plug contacts 34, 44 and the openings 36, 46 in the respective connector housings are mutually matched in terms of position in such a way that in the mounted state, the plug contacts 34 extend into the connector 40 via the openings 46 and the plug contacts 44 extend into the connector 30 via the openings 36. The two connectors 30, 40 are rigidly connected to the component board 50 by means of the clamping members 25 without the danger of being shaken loose or the like. Note that the connectors 30 and 40 are each not fully loaded with contact elements 32 and 42, respectively, which is advantageously from manufacturing and cost point of view.

Alternative clamping means 55, 56, 57 suitable for the purpose of the invention are shown in FIGS. 5a, b, c. In the English-language literature, these clamping means are also referred to by the designation "press-fit" or "press-in".

The invention is, of course, not restricted to the embodiments shown of clamping means and contact element combinations.

We claim:

1. An electrical assembly, comprising a first printed circuit (PC) board having a top and bottom side and a second PC board having a top and bottom side, said second PC board being coupled to said first PC board by at least one connector assembly, wherein said first and second PC boards are held substantially parallel to each other by said at least one connector assembly, wherein said first and second PC boards each comprise a hole pattern comprising a plurality of holes, and wherein said connector assembly comprises:

a first connector having a first connector bottom side positioned adjacent to said top side of said first PC board, and a first connector top side, whereby said first connector is surface mounted to the top side of said first PC board; and a second connector having a second connector bottom side coupled to said first connector top side, and a second connector top side positioned adjacent to said bottom side of said second PC board, whereby said second connector is surface mounted to the bottom side of said second PC board; and a third connector having a third connector top side positioned adjacent to said bottom side of said first PC board, and a third connector bottom side, whereby said third connector is surface mounted to the bottom side of said first PC board;

wherein said first connector further comprises a plurality of central contact elements extending from said first connector bottom side into, and making a clamping engagement with, respective holes of said first PC board hole pattern, and said second connector further comprises a second plurality of central contact elements extending from said second connector top side into, and making a clamping engagement with, respective holes of said second PC board hole pattern; and wherein said third connector further comprises a plurality of central contact elements extending from said third connector top side into, and making a clamping engagement with, respective holes of said first PC board hole pattern, wherein the holes into which the third connector central contact elements extend are different from the holes into which the first connector central contact elements extend.

2. An assembly as recited in claim 1, wherein said first and second connectors have end-to-end stackable housings.

3. An assembly as recited in claim 2, wherein said central contact elements of said first and second connectors include means for being electrically connected to electrical wiring.

4. An assembly as recited in claim 1, wherein said top side of said first PC board further comprises a pattern of electrically conductive signal terminals situated such that a first group of said signal terminals is position on said first PC board on a first side of said hole pattern and a second group of said signal terminals is positioned on said first PC board on a second side of said board hole pattern; and wherein the holes of said first PC board hole pattern are plated with an electrically conductive material; and wherein said first connector further comprises a plurality of signal contacts constructed and arranged to make electrical contact with said signal terminals of said first PC board, said signal contacts being arranged such that pairs of signal contacts including signal contacts disposed on opposite sides of said first PC board hole pattern are separated by at least one of said central contact elements extending into a hole situated between the terminals to which said signal contacts of said pair are connected.

5. An assembly as recited in claim 4, wherein said central contact elements of said first connector are grounded, whereby cross-talk between signal contacts on opposite sides of said central contact elements is minimized.

6. An assembly as recited in claim 1, wherein said central contact elements of said first and second connectors include means for being electrically connected to electrical wiring.

* * * * *